United States Patent
Ishizuka et al.

(10) Patent No.: US 8,921,691 B2
(45) Date of Patent: Dec. 30, 2014

(54) SOLAR CELL AND MANUFACTURING METHOD THEREOF

(75) Inventors: Shogo Ishizuka, Tsukuba (JP); Shigeru Niki, Tsukuba (JP); Nobuaki Kido, Tokyo (JP); Hiroyuki Honmoto, Iwakuni (JP)

(73) Assignee: National Institute of Advanced Industrial Science and Technology (JP)

( * ) Notice: Subject to any disclaimer, the term of this patent is extended or adjusted under 35 U.S.C. 154(b) by 504 days.

(21) Appl. No.: 12/922,996

(22) PCT Filed: Mar. 19, 2009

(86) PCT No.: PCT/JP2009/055444
§ 371 (c)(1),
(2), (4) Date: Oct. 4, 2010

(87) PCT Pub. No.: WO2009/116626
PCT Pub. Date: Sep. 24, 2009

(65) Prior Publication Data
US 2011/0023963 A1 Feb. 3, 2011

(30) Foreign Application Priority Data

Mar. 21, 2008 (JP) .................. 2008-074429

(51) Int. Cl.
*H01L 31/0336* (2006.01)
*H01L 31/0392* (2006.01)

(52) U.S. Cl.
CPC ......... *H01L 31/03923* (2013.01); *Y02E 10/541* (2013.01)
USPC ............. 136/262; 136/254; 136/265; 438/85; 438/95

(58) Field of Classification Search
CPC ............. Y02E 10/541; H01L 31/0749; H01L 31/03923; H01L 21/02568; H01L 31/0392; H01L 31/1864; H01L 31/03928; H01L 21/02422; H01L 31/0323; H01L 21/02485
USPC ............ 136/262, 258, 264, 265, 256; 438/77, 438/78, 84, 85, 86, 93

See application file for complete search history.

(56) References Cited

U.S. PATENT DOCUMENTS

| | | | | |
|---|---|---|---|---|
| 5,626,688 A | * | 5/1997 | Probst et al. | 136/265 |
| 6,166,319 A | * | 12/2000 | Matsuyama | 136/249 |
| 6,441,301 B1 | | 8/2002 | Satoh et al. | 136/265 |
| 2003/0013838 A1 | * | 1/2003 | Yamashita et al. | 528/170 |
| 2009/0308437 A1 | * | 12/2009 | Woods et al. | 136/255 |

FOREIGN PATENT DOCUMENTS

| | | |
|---|---|---|
| JP | 5-259494 | 10/1993 |
| JP | 2001-339081 | * 12/2001 |
| JP | 2004-79858 | 3/2004 |

(Continued)

OTHER PUBLICATIONS

International Search Report and Written Opinion mailed Jun. 23, 2009 in corresponding international application No. PCT/JP2009/055444.

(Continued)

*Primary Examiner* — Jayne Mershon
(74) *Attorney, Agent, or Firm* — Ostrolenk Faber LLP

(57) ABSTRACT

There is provided a solar cell in which a lower electrode layer, a photoelectric conversion layer having a chalcopyrite structure that includes a Group Ib element, a Group IIIb element, and a Group VIb element, and an upper electrode layer are sequentially formed on top of a substrate, wherein the solar cell is provided with a silicate layer between the substrate and the lower electrode layer.

18 Claims, 1 Drawing Sheet

(56) References Cited

FOREIGN PATENT DOCUMENTS

| | | |
|---|---|---|
| JP | 2005-217067 | 8/2005 |
| JP | 2007-201069 | 8/2007 |

OTHER PUBLICATIONS

V. Probst, et al., "Advanced stacked elemental layer process for Cu(In,Ga)$^{Se}$2 thin film photovoltaic devices," Mat. Res. Soc. Symp. Proc., vol. 246, pp. 165-176 (1996), Materials Research Society.

D. Rudmann, et al., "Efficiency enhancement of Cu(In,Ga)$^{Se}$2 solar cells due to post-deposition Na incorporation," Applied Physics Letter, vol. 84(7), pp. 1129-1131 (2004), American Institute of Physics.

D. Rudmann, et al., "Na incorporation into Cu(In,Ga)Se$_2$ for high-efficiency flexible solar cells on polymer foils," Journal of Applied Physics, vol. 97, pp. 84903-1-5 (2005), American Institute of Physics.

\* cited by examiner

SOLAR CELL AND MANUFACTURING METHOD THEREOF

CROSS-REFERENCE TO RELATED APPLICATIONS

The present application is a 35 U.S.C. §371 National Phase conversion of PCT/JP2009/055444, filed Mar. 19, 2009, which claims benefit of Japanese Patent Application No. 2008-074429, filed Mar. 21, 2008, the contents of which are incorporated herein by reference. The PCT International Application was published in the Japanese language.

TECHNICAL FIELD

The present invention relates to a solar cell and a manufacturing method thereof. More specifically, the present invention relates to a technique capable of further enhancing the efficiency of a CIS-based solar cell that uses an alkali-free glass substrate, a metal substrate, a heat resistant plastic substrate or the like and includes $Cu(In_{1-x}Ga_x)(Se_yS_{1-y})_2$ ($0 \leq x \leq 1$, $0 \leq y \leq 1$) as a major component thereof.

BACKGROUND ART

In recent years, CIS-based solar cells having a structure provided with a photoelectric conversion layer constituted of compounds of metals such as copper (Cu), indium (In) and selenium (Se) (CIS-based thin films) as well as a lower electrode layer and an upper electrode layer, unlike conventional crystalline silicon based solar cells, are attracting attention as new generation solar cells. Since there are advantages associated with the CIS-based solar cells such as their simple structure, the ease of making them into large solar area cells, the simple production process therefor and their energy saving potential, various studies have been conducted and various suggestions have also been made.

In order to improve the performance of CIS-based solar cells, alkali metals such as sodium (Na) need to be added to the photoelectric conversion layer. In those cases where soda lime glass or the like which generally includes soda lime ($Na_2O \cdot CaO \cdot 5SiO_2$) as a major component thereof is used as a substrate, there is no need to intentionally add alkali metals since the alkali metals contained in the substrate diffuse into CIS metals constituting the photoelectric conversion layer. On the other hand, in those cases where alkali-free glass or low alkali glass excellent in heat resistance is used as a substrate or cases where a metal foil substrate or a substrate made of plastic such as polyimide is used for the sake of preparing a flexible solar cell, since the diffusion of alkali metals cannot be expected from the substrate, it is necessary to diffuse alkali metals into the CIS-based thin films by using an alkali precursor.

In these cases, it is common to use sodium fluoride (NaF) or the like as an alkali precursor, and various methods have been employed, such as a method in which the precursor is deposited on top of a lower electrode layer (Non-Patent Document 1), and a method in which the precursor is deposited, following formation of a CIS-based photoelectric conversion layer, on top of the photoelectric conversion layer and is then diffused thereinto by a heat treatment (Non-Patent Documents 2 and 3).

[Non-Patent Document 1] V. Probst, et al., Advanced stacked elemental layer process for $Cu(In,Ga)Se_2$ thin film photovoltaic devices, MRS Symp. Proc., Materials Research Society, vol. 426 (1996) p. 165

[Non-Patent Document 2] D. Rudmann, et al., Efficiency enhancement of $Cu(In,Ga)Se_2$ solar cells due to post-deposition Na incorporation, Applied Physics Letters, American Institute of Physics, vol. 84, p. 1129 (2004)

[Non-Patent Document 3] D. Rudmann, et al., Na incorporation into $Cu(In,Ga)Se_2$ for high-efficiency flexible solar cells on polymer foils, Journal of Applied Physics, American Institute of Physics, vol. 97, p. 084903-1-5 (2005)

DISCLOSURE OF INVENTION

Problems to be Solved by the Invention

Incidentally, many of the alkali precursors including sodium fluoride (NaF) which have been used conventionally exhibit properties such as hygroscopicity and deliquescent properties. For this reason, in the method where the precursors are deposited on top of a lower electrode layer, there have been problems such as the deterioration of precursors before the formation of a photoelectric conversion layer since the precursors are left standing in the atmosphere for a long period of time after being deposited on top of the lower electrode layer.

In addition, in the method where a heat treatment is conducted following the precursor deposition on top of a photoelectric conversion layer, the number of required steps increases since an additional step for the heat treatment is required following the deposition step, leading to an increase in the production cost, which is a significant disadvantage industrially.

Moreover, in any of the above methods, the presence of an alkali precursor as a foreign material within an extremely important portion of the device in terms of the function thereof such as the interface between the lower electrode layer and the photoelectric conversion layer or the interface between the photoelectric conversion layer and a buffer layer has been a concern when improving the performance of solar cells due to the possible performance deterioration.

In particular, there is a growing interest in the flexible solar cells and the like in recent years which are taking advantages of the characteristics of CIS-based solar cells having the highest performance among the thin film solar cells. Accordingly, in order to put the high performance CIS-based solar cells using alkali-free or low alkali substrates such as various flexible substrates represented by metal foils and plastics into practical use, development of a method which is simple as well as functional for adding alkali metals such as sodium (Na) to a photoelectric conversion layer has been desired.

The present invention is made in order to solve the above-mentioned problems, with an object of providing a solar cell prepared by simply and functionally adding an alkali metal such as sodium (Na) to a photoelectric conversion layer of a CIS-based solar cell and a production method thereof.

Means for Solving the Problems

The present inventors have conducted intensive and extensive studies in order to solve the above-mentioned problems and discovered the following as a result to complete the present invention: that is, if a silicate layer is provided between a substrate and a lower electrode layer, an alkali metal that originates from this silicate layer passes through a back electrode layer and diffuses into a CIS-based thin film, and thus it is possible to further improve the efficiency of CIS-based solar cells having $Cu(In_{1-x}Ga_x)(Se_yS_{1-y})_2$ ($0 \leq x \leq 1$, $0 \leq y \leq 1$) as a major component thereof without incurring deterioration in their characteristics, deterioration of the alkali metal or the like, or an increase in the production cost.

That is, the solar cell of the present invention is a solar cell in which a lower electrode layer, a photoelectric conversion layer having a chalcopyrite structure that includes a Group Ib element, a Group IIIb element and a Group VIb element, and an upper electrode layer are sequentially formed on top of a substrate, characterized in that the solar cell includes a silicate layer provided between the aforementioned substrate and the aforementioned lower electrode layer.

It is preferable that the aforementioned photoelectric conversion layer having a chalcopyrite structure be a CIS-based photoelectric conversion layer that includes $Cu(In_{1-x}Ga_x)(Se_yS_{1-y})_2$ ($0 \leq x \leq 1$, $0 \leq y \leq 1$) as a major component thereof.

The aforementioned silicate layer preferably includes $aX_2O \cdot bYO \cdot cSiO_2$ (where a, b and c represent positive integers, X represents a Group Ia alkali metal element, and Y represents a Group IIa alkaline earth metal element) as a major component thereof.

The aforementioned substrate is preferably made of a heat resistant polyimide.

The aforementioned heat resistant polyimide is preferably a wholly aromatic polyimide having a repeating unit represented by a formula (I) shown below:

[Chemical Formula 1]

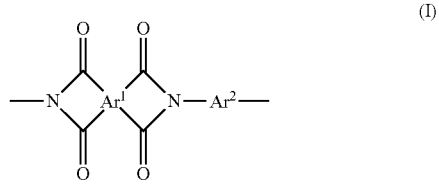

(I)

(wherein $Ar^1$ represents a tetravalent aromatic group of 6 to 20 carbon atoms, and $Ar^2$ represents a divalent aromatic group of 6 to 20 carbon atoms which may contain an unreactive substituent).

The method of the present invention for producing a solar cell is a production method of a solar cell by sequentially forming a silicate layer, a lower electrode layer, a photoelectric conversion layer having a chalcopyrite structure that includes a Group Ib element, a Group IIIb element and a Group VIb element, and an upper electrode layer on top of a substrate, characterized in that the aforementioned silicate layer is deposited on top of the aforementioned substrate by a magnetron sputtering process.

The aforementioned magnetron sputtering process is preferably a radio frequency magnetron sputtering process.

Effects of the Invention

According to the solar cell of the present invention, since a silicate layer that exhibit no hygroscopicity, deliquescent properties, or the like is provided between the substrate and the lower electrode layer, unlike conventional solar cells in which an alkali precursor such as sodium fluoride (NaF) is deposited on top of the lower electrode layer or the photoelectric conversion layer, the performance of CIS-based solar cell can be enhanced without impairing the bonding properties within the interface between the substrate and the lower electrode layer or the interface between the photoelectric conversion layer and the buffer layer.

Further, by providing the silicate layer between the substrate and the lower electrode layer, a wide range of materials like alkali-free glass, low alkali glass, metal foils and plastics such as polyimide can be used as a substrate material. In particular, when a metal foil is used as a substrate, although an electrically insulating layer is required between the substrate and the lower electrode layer for the sake of integration of the solar cells, this silicate layer also plays a role as an insulating layer. Accordingly, the number of options for the substrate material increases, and CIS-based solar cells with various shapes and properties, such as a light-weight flexible solar cell can be produced.

According to the method of the present invention for producing a solar cell, since the silicate layer is deposited on top of the substrate by a magnetron sputtering process, a high-performance CIS-based solar cell can be prepared easily and also at a low cost without impairing the bonding properties within the interface between the substrate and the lower electrode layer or the interface between the photoelectric conversion layer and the buffer layer.

Moreover, since the silicate layer is deposited on top of the substrate by a magnetron sputtering process, a wide range of materials like alkali-free glass, low alkali glass, metal foils and plastics such as polyimide can be used as a substrate material, thereby enabling production of CIS-based solar cells with various shapes and properties.

DESCRIPTION OF THE REFERENCE SYMBOLS

Figure 1:
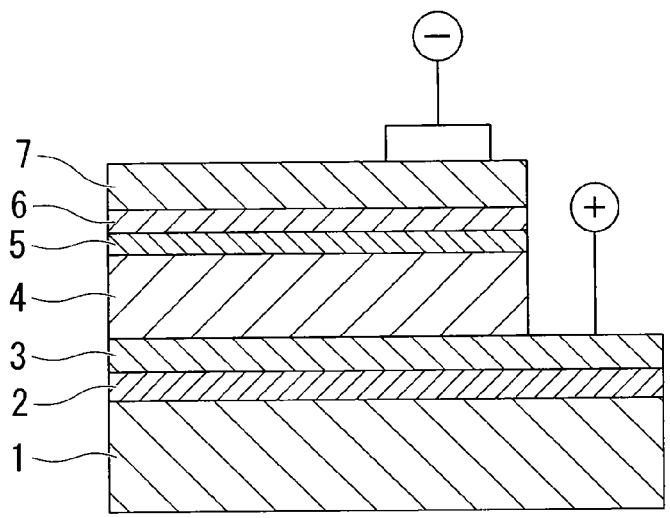
FIG. 1 is a cross sectional diagram showing a CIS-based solar cell according to an embodiment of the present invention.

1. Substrate
2. Silicate layer
3. Back electrode layer
4. CIS-based photoelectric conversion layer
5. Buffer layer
6. Highly resistive zinc oxide layer
7. Transparent conductive layer
8. Grid electrode

BEST MODE FOR CARRYING OUT THE INVENTION

A preferred embodiment for achieving a solar cell and the production method thereof according to the present invention will be described.

It should be noted that the embodiment is provided to specifically explain the outline of the present invention for the better understanding, and is not for limiting the scope of the present invention unless stated otherwise.

FIG. 1 is a cross sectional diagram showing a laminated structure of a CIS-based solar cell according to an embodiment of the present invention. In FIG. 1, the reference numerals 1, 2, 3, 4, 5, 6, 7 and 8 indicate a substrate, a silicate layer, a back electrode layer (lower electrode layer) made of a metal having a high melting point such as molybdenum (Mo), a CIS-based photoelectric conversion layer, a buffer layer composed of cadmium sulfide (CdS) or the like, a highly resistive zinc oxide layer, a transparent conductive layer (upper electrode layer) constituted of a zinc oxide-based transparent conductive material, and a grid electrode made of aluminum (Al), respectively.

As a material for the substrate 1, alkali-free glass, low alkali glass, ceramics, foils of metals such as titanium (Ti) and stainless steel, plastics such as a heat resistant polyimide, and inorganic materials such as carbon fibers can be used. The shape of the substrate 1 can be appropriately selected from a plate shape, a sheet shape or a film shape in accordance with the intended use or properties thereof.

As the heat resistant polyimide, a wholly aromatic polyimide having a repeating unit represented by a formula (I) shown below can be preferably used:

[Chemical Formula 2]

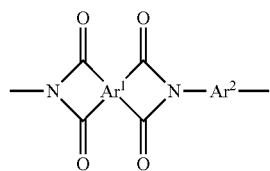

(I)

(wherein $Ar^1$ represents a tetravalent aromatic group of 6 to 20 carbon atoms, and $Ar^2$ represents a divalent aromatic group of 6 to 20 carbon atoms which may contain an unreactive substituent)

Specific examples of preferred $Ar^1$ and $Ar^2$ include those constituting the following aromatic tetracarboxylic acid and aromatic diamine components.

As an aromatic tetracarboxylic acid component that constitutes a polyimide, pyromellitic acid can be mentioned. However, other aromatic tetracarboxylic acids may be used as the aromatic tetracarboxylic acid component as long as they do not exceed 25 mol %.

Examples of the usable aromatic tetracarboxylic acids include 1,2,3,4-benzenetetracarboxylic acid, 2,3,5,6-pyridinetetracarboxylic acid, 2,3,4,5-thiophenetetracarboxylic acid, 2,2',3,3'-benzophenonetetracarboxylic acid, 2,3',3,4'-benzophenonetetracarboxylic acid, 3,3',4,4'-benzophenonetetracarboxylic acid, 3,3',4,4'-biphenyltetracarboxylic acid, 2,2',3,3'-biphenyltetracarboxylic acid, 2,3,3',4'-biphenyltetracarboxylic acid, 3,3',4,4'-p-terphenyltetracarboxylic acid, 2,2',3,3'-p-terphenyltetracarboxylic acid, 2,3,3',4'-p-terphenyltetracarboxylic acid, 1,2,4,5-naphthalenetetracarboxylic acid, 1,2,5,6-naphthalenetetracarboxylic acid, 1,2,6,7-naphthalenetetracarboxylic acid, 1,4,5,8-naphthalenetetracarboxylic acid, 2,3,6,7-naphthalenetetracarboxylic acid, 2,3,6,7-anthracenetetracarboxylic acid, 1,2,5,6-anthracenetetracarboxylic acid, 1,2,6,7-phenanthrenetetracarboxylic acid, 1,2,7,8-phenanthrenetetracarboxylic acid, 1,2,9,10-phenanthrenetetracarboxylic acid, 3,4,9,10-perylenetetracarboxylic acid, 2,6-dichloronaphthalene-1,4,5,8-tetracarboxylic acid, 2,7-dichloronaphthalene-1,4,5,8-tetracarboxylic acid, 2,3,6,7-tetrachloronaphthalene-1,4,5,8-tetracarboxylic acid, 1,4,5,8-tetrachloronaphthalene-2,3,6,7-tetracarboxylic acid, bis(2,3-dicarboxyphenyl)ether, bis(3,4-dicarboxyphenyl)ether, bis(2,3-dicarboxyphenyl)methane, bis(3,4-dicarboxyphenyl)methane, bis(2,3-dicarboxyphenyl)sulfone, bis(3,4-dicarboxyphenyl)sulfone, 1,1-bis(2,3-dicarboxyphenyl)ethane, 1,1-bis(3,4-dicarboxyphenyl)ethane, 2,2-bis(2,3-dicarboxyphenyl)propane, 2,2-bis(3,4-dicarboxyphenyl)propane, 2,6-bis(3,4-dicarboxyphenoxy)pyridine, 1,1,1,3,3,3-hexafluoro-2,2-bis(3,4-dicarboxyphenyl)propane and bis(3,4-dicarboxyphenyl)dimethyl silane.

Further, two or more of these aromatic tetracarboxylic acid components can be used at the same time. Although a component consisted solely of pyromellitic acid is preferable as an aromatic tetracarboxylic acid component, other preferable examples include those using 3,3',4,4'-biphenyltetracarboxylic acid, 3,3',4,4'-benzophenonetetracarboxylic acid, 1,4,5,8-naphthalenetetracarboxylic acid or the combination thereof.

Examples of the aromatic diamine component that constitutes $Ar^2$ in the above formula (1) following imidation reaction include 1,4-phenylenediamine, 1,3-phenylenediamine, 1,4-diaminonaphthalene, 1,5-diaminonaphthalene, 2,6-diaminonaphthalene, 2,7-diaminonaphthalene, 2,5-diaminopyridine, 2,6-diaminopyridine, 3,5-diaminopyridine, 2,4-diaminotoluene benzidine, 3,3'-diaminobiphenyl, 4,4'-diaminobiphenyl, 3,3'-dichlorobenzidine, 3,3'-dimethylbenzidine, 3,3'-dimethoxybenzidine, 2,2'-diaminobenzophenone, 4,4'-diaminobenzophenone, 3,3'-diaminodiphenylether, 4,4'-diaminodiphenylether, 3,4'-diaminodiphenylether, 3,3'-diaminodiphenylmethane, 4,4'-diaminodiphenylmethane, 4,4'-diaminodiphenylsulfone, 3,4'-diaminodiphenylsulfone, 4,4'-diaminodiphenylsulfone, 3,3'-diaminodiphenylsulfide, 3,4'-diaminodiphenylsulfide, 4,4'-diaminodiphenylsulfide, 4,4'-diaminodiphenylthioether, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 4,4'-bis(3-aminophenoxy)diphenylsulfone, 4,4'-bis(4-aminophenoxy)diphenylsulfone, 4,4'-bis(4-aminophenoxy)biphenyl, bis[4-(3-aminophenoxy)phenyl]sulfone, bis[4-(4-aminophenoxy)phenyl]sulfone and bis[4-(4-aminophenoxy)phenyl]ether, and the products thereof in which their aromatic nuclei are substituted with a halogen atom or an alkyl group.

Two or more of the above-mentioned aromatic diamine components can be used at the same time. Further, preferable examples of aromatic diamine components include 1,4-phenylenediamine, 1,3-phenylenediamine, 3,4'-diaminodiphenylether, 1,3-bis(3-aminophenoxy)benzene and 4,4'-diaminodiphenylether. More preferably, in terms of the aromatic diamine component, by making the amount of 1,4-phenylenediamine at least 30 mol % based on the combined total of all diamine components, it is possible to obtain a polyimide film having a coefficient of linear expansion of 12 ppm/° C. or less within a temperature range from 100 to 250° C. The more the amount of 1,4-phenylenediamine component, the easier a coefficient of linear expansion of 12 ppm/° C. or less can be achieved. For this reason, the amount of 1,4-phenylenediamine used is preferably from 40 to 100 mol %, more preferably from 50 to 100 mol %, and still more preferably from 60 to 100 mol %.

However, in those cases where a phenylenediamine in a para-orientation, such as 3,4'-diaminodiphenylether, 1,4-diaminonaphthalene, 2,6-diaminonaphthalene, 4,4'-diaminobiphenyl and 3,4'-diaminodiphenylsulfide is used, it is possible to reduce the ratio of 1,4-phenylenediamine. In such cases, the ratio of 1,4-phenylenediamine is preferably from 30 to 90 mol %, more preferably from 35 to 80 mol %, still more preferably from 40 to 70 mol %, and most preferably from 45 to 60 mol %.

As mentioned above, the polyimide is preferably a copolymer containing a pyromellitic acid component and a different kind of aromatic tetracarboxylic acid component, as well as 1,4-phenylenediamine and a different kind of diamine component, and a polyimide which is a quaternary copolymer including the following repeating units (A) to (D) and having the molar ratio between the repeating unit (A) and repeating unit (B) of from 80:20 to 20:80 and the molar ratio between the repeating unit (C) and repeating unit (D) of from 95:5 to 5:95 is particularly desirable.

[Chemical Formula 3]

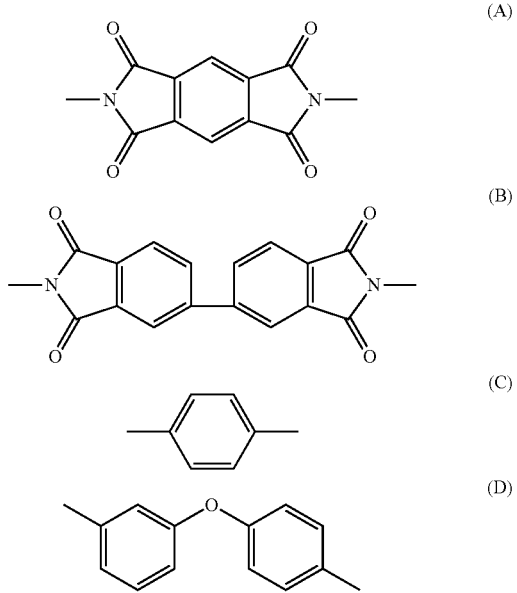

The molar ratio between the repeating unit (A) and repeating unit (B) is preferably from 70:30 to 30:70 and more preferably from 55:45 to 45:55.

The molar ratio between the repeating unit (C) and repeating unit (D) is preferably from 95:5 to 50:50.

The silicate layer 2 has a structure which is stabilized by partially incorporating an alkali metal (Li, Na, K, Rb, Cs, Fr) or an alkaline earth metal (Be, Mg, Ca, Sr, Ba, Ra) known as a network-modifier or a network modifying ion within a network structure of silicon dioxide ($SiO_2$), and remains stable even when being left standing in the atmosphere for some time following the thin film formation. Therefore, there is no concern for the deterioration thereof or the like, and also there is no need for special treatments such as a heat treatment for causing diffusion or the like.

The silicate layer 2 preferably includes $aX_2O.bYO.cSiO_2$ (wherein a, b and c represent positive integers, X represents a Group Ia alkali metal element, and Y represents a Group IIa alkaline earth metal element) as a major component thereof. Specific examples of the major component represented by $aX_2O.bYO.cSiO_2$ include $Na_2O.CaO.5SiO_2$ and $Na_2O.2MgO.6SiO_2$. Of these, soda lime glass having $Na_2O.CaO.5SiO_2$ as a major component thereof is preferred. The thickness of the silicate layer 2 is about 20 nm to about 500 nm.

The silicate layer 2 is provided, not on top of the back electrode layer 3 as in conventional cases, but between the substrate 1 and the back electrode layer 3. By doing so, the alkali metal contained in the silicate layer 2 passes through and diffuses into the back electrode layer 3, due to a high temperature generated during formation of a CIS-based photoelectric conversion layer 4, and is consequently added to the CIS-based photoelectric conversion layer 4.

In this structure, since there is no need to incorporate an alkali precursor serving as a foreign material between the back electrode layer 3 and the CIS-based photoelectric conversion layer 4 or between the photoelectric conversion layer 4 and a buffer layer 5 which is an extremely important portion of the CIS-based solar cell for developing the characteristics thereof, deterioration in the characteristics caused by the foreign material can be avoided, and a high performance CIS-based solar cell can be obtained.

The CIS-based photoelectric conversion layer 4 is a semiconductor thin film having a chalcopyrite structure that includes a Group Ib element (such as Cu, Ag and Au), a Group IIIb element (such as B, Al, Ga, In and Tl) and a Group VIb element (such as S, Se, Te and Po), and, for example, is a CIS-based semiconductor thin film having $Cu(In_{1-x}Ga_x)(Se_yS_{1-y})_2$ ($0 \leq x \leq 1$, $0 \leq y \leq 1$) as a major component thereof. Here, in those cases where Ga and S are not dissolved (that is, when x=y=0), a semiconductor thin film is composed of $CuInSe_2$.

Next, explanation is given of the method for producing a CIS-based solar cell according to the present embodiment.

By using a sputtering target composed of a silicate salt as a starting material for the silicate layer 2, the silicate layer 2 is deposited on top of the substrate 1 by a magnetron sputtering process, preferably a radio frequency (RF) magnetron sputtering process, so that the thickness thereof will be about 20 nm to about 500 nm.

Subsequently, by using a sputtering target composed of molybdenum (Mo), the back electrode layer 3 is deposited on top of the silicate layer 2 by a sputtering process so that the thickness thereof will be from 100 nm to 2,000 nm, preferably about 800 nm.

Then, employing a Group Ib element (such as Cu, Ag and Au), a Group IIIb element (such as B, Al, Ga, In and Tl) and a Group VIb element (such as S, Se, Te and Po) as each independent evaporation sources, the CIS-based photoelectric conversion layer 4 is deposited on top of the back electrode layer 3 by a multi-source deposition method using these evaporation sources, so that the thickness thereof will be from 1 μm to 3 μm, preferably about 2 μm. The CIS-based photoelectric conversion layer 4 may be formed by a selenization method, an electrodeposition method, a coating method or the like.

Then, the buffer layer 5 is deposited on top of the CIS-based photoelectric conversion layer 4 by a chemical bath deposition (CBD) method so that the thickness thereof will be from 20 nm to 150 nm, preferably about 50 nm.

Subsequently, by using a sputtering target composed of zinc oxide as a starting material for a highly resistive zinc oxide layer 6, the highly resistive zinc oxide layer 6 is deposited on top of the buffer layer 5 so that the thickness thereof will be from 20 nm to 200 nm, preferably about 70 nm.

Next, by using a sputtering target composed of aluminum-added zinc oxide (AZO) as a starting material for a transparent conductive layer 7 in which 1 to 3% by mass of alumina ($Al_2O_3$) is dissolved in zinc oxide (ZnO), the transparent conductive layer 7 is deposited on top of the highly resistive zinc oxide layer 6 so that the thickness thereof will be from 100 nm to 1,000 nm, preferably about 500 nm.

Then, a grid electrode 8 is formed on top of the transparent conductive layer 7 by a vacuum deposition method using aluminum as an evaporation source.

In the manner as described above, the CIS-based solar cell according to the present embodiment can be obtained.

EXAMPLES

As follows is a more detailed description of the present invention based on a series of examples. However, the scope of the present invention is in no way limited by these examples.

Example 1

21 kg of dehydrated N-methyl-2-pyrrolidone (NMP) was placed in a reaction vessel equipped with a thermometer, a stirrer and a raw material inlet in a nitrogen atmosphere, and was completely dissolved by further adding 340.0 g of 1,4-phenylenediamine and 629.3 g of 3,4'-diaminodiphenylether thereto. Then, the temperature of the diamine solution was adjusted to 20° C. 1,371 g of pyromellitic anhydride was added to the diamine solution over a plurality of times in a stepwise manner and allowed to react for 1 hour. The temperature of the reaction solution at the time was 20 to 40° C. Further, the temperature of the reaction solution was raised to 60° C., and the reaction was allowed to proceed for 2 hours, thereby obtaining a polyamic acid NMP solution in the form of a viscous solution.

The obtained polyamic acid solution was cast on a glass plate to a thickness of 400 μm using a doctor blade, and was then immersed in a 30° C. dehydration/condensation bath which was prepared from 1,050 ml of acetic anhydride, 450 g of pyridine and 1,500 ml of NMP, for 8 minutes to allow the imidation/isoimidation reaction to proceed. The resultant was then separated from the glass plate that served as a support, thereby obtaining a gel film.

Subsequently, the obtained gel film was immersed in NMP at room temperature for 20 minutes for washing, and then both ends of the gel film were anchored with a chuck and simultaneous biaxial stretching was carried out at room temperature to a factor of 2.0 in each of the orthogonal biaxial directions at a rate of 10 mm/sec.

The stretched gel film was fixed onto a frame and subjected to a drying treatment at 160° C. by a hot air dryer using dry air for 20 minutes. Then, a hot air circulating oven was used for stepwise temperature increase from 300° C. to 450° C. to obtain a base material (A) constituted of a wholly aromatic polyimide film.

The base material (A) was a base material constituted of a wholly aromatic polyimide film having 50 mol % of a repeating unit represented by a formula (I-a) shown below:

[Chemical Formula 4]

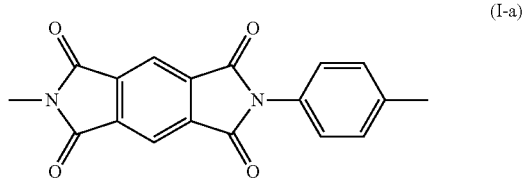

(I-a)

and 50 mol % of a repeating unit represented by a formula (I-b) shown below:

[Chemical Formula 5]

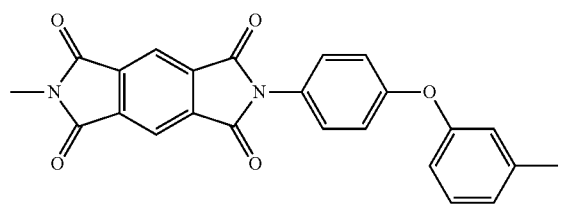

(I-b)

The obtained base material (A) had a thickness of 14 μm and a Young's modulus in the lengthwise and widthwise directions of 9 GPa.

Then, a silicate layer having a thickness of 200 nm was deposited on top of the base material (A) by a radio frequency (RF) magnetron sputtering process using a target composed of soda lime glass.

Subsequently, by using a target composed of molybdenum (Mo), a back electrode layer having a thickness of 800 nm was deposited on top of the silicate layer by a sputtering process.

Then, employing Cu, In, Ga and Se as each independent evaporation sources, a CIS-based photoelectric conversion layer having a thickness of 2 μm was deposited on top of the back electrode layer 3 by a multi-source deposition method through the so-called three-stage process using these evaporation sources.

Next, a buffer layer having a thickness of 50 nm was deposited on top of the CIS-based photoelectric conversion layer by a chemical bath deposition (CBD) method.

Subsequently, by using a target composed of zinc oxide, a highly resistive zinc oxide layer having a thickness of 70 nm was deposited on top of the buffer layer.

Next, by using a target composed of aluminum-added zinc oxide (AZO), a transparent conductive layer having a thickness of 500 nm was deposited on top of the highly resistive zinc oxide layer.

Then, a grid electrode was formed on top of the transparent conductive layer by a vacuum deposition method using aluminum as an evaporation source, thereby obtaining a CIS-based solar cell of Example 1.

Figure 2:
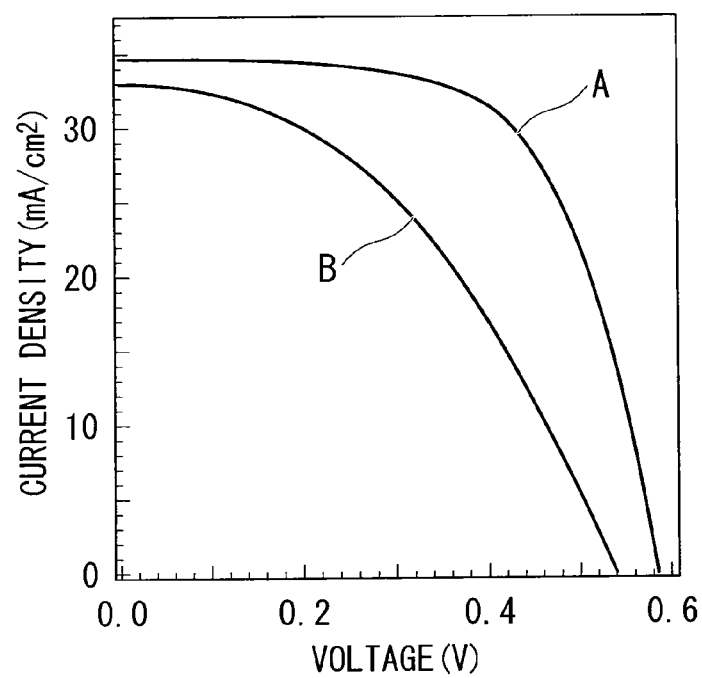
FIG. 2 is a diagram showing the respective current-voltage characteristic curves for the CIS-based solar cell according to an embodiment of the present invention and for the conventional CIS-based solar cell.

FIG. 2 is a diagram showing the respective current-voltage characteristic curves for the CIS-based solar cell of the present example having a silicate layer (curve A in the diagram) and for the conventional CIS-based solar cell with no silicate layer (curve B in the diagram), where light was irradiated at 100 mW/cm$^2$ with an air mass (AM) of 1.5 G.

For the CIS-based solar cell of the present example, the conversion efficiency was 12.8%, the open circuit voltage was 0.585 V, the short circuit current density was 34.6 mA/cm$^2$, the fill factor was 0.632, and the effective area was 0.460 cm$^2$.

Example 2

1,410 g of dehydrated N-dimethylacetamide (hereafter, abbreviated as DMAc) was placed in a reaction vessel equipped with a thermometer, a stirrer and a raw material inlet in a nitrogen atmosphere, and was completely dissolved by further adding 52.099 g (0.4818 mol) of para-phenylenediamine (PPDA) and 10.721 g (0.0535 mol) of 3,4'-diaminodiphenylether (ODA) thereto. Then, the aromatic diamine compound (DMAc) solution was cooled in an ice bath, thereby adjusting the temperature thereof to 3° C. 58.381 g (0.2675 mol) of pyromellitic dianhydride (PMDA) and 78.750 g (0.2675 mol) of 3,3',4,4'-biphenyltetracarboxylic dianhydride (BPDA) were added to the cooled aromatic diamine compound (DMAc) solution in a stepwise manner for three times and allowed to react for 1 hour. The temperature of the reaction solution at the time was 30 to 40° C. Further, the temperature of the reaction solution was raised to 60° C., and the reaction was allowed to proceed for 3 hours, thereby obtaining a 12 wt. % polyamic acid DMAc solution in the form of a viscous solution. The reduced viscosity of the obtained polyamic acid was 5.82 dl/g.

The obtained 12 wt. % polyamic acid DMAc solution was cast onto a glass plate (having a thickness of 1.1 mm) using an applicator with a lip opening of 400 μm, and was then subjected to drying and heat treatments by a hot air dryer using dry air by raising the temperature stepwise from 260° C. to 300° C. Then, a hot air circulating oven was used for stepwise temperature increase from 300° C. to 450° C. to obtain a polyimide film. Subsequently, a CIS-based solar cell was obtained in the same manner as described above in Example 1. For the CIS-based solar cell of Example 2, the conversion efficiency was 14.7%, the open circuit voltage was 0.619 V, the short circuit current density was 36.0 mA/cm², the fill factor was 0.658, and the effective area was 0.496 cm².

On the other hand, for the conventional CIS-based solar cell, the conversion efficiency was 7.6%, the open circuit voltage was 0.541 V, the short circuit current density was 33.1 mA/cm², the fill factor was 0.426, and the effective area was 0.506 cm².

According to the results shown in FIG. 2, it was found that the CIS-based solar cell of the present example having a silicate layer exhibited a high open circuit voltage which was a characteristic of those added with an alkali metal, and thus was highly efficient, as compared to the conventional CIS-based solar cell with no silicate layer.

Therefore, it became evident that by providing the silicate layer 2 between the substrate 1 and the back electrode layer 3, even when alkali-free glass, low alkali glass, metal foils, plastics such as a heat resistant polyimide, carbon fibers or the like is used as a substrate material, a highly efficient CIS-based solar cell can be produced.

According to the CIS-based solar cell of the present embodiment, since the silicate layer 2 is provided between the substrate 1 and the back electrode layer 3, the performance of CIS-based solar cell can be enhanced without impairing the bonding properties within the interface between the substrate 1 and the back electrode layer 3.

Moreover, since the silicate layer 2 is provided between the substrate 1 and the back electrode layer 3, alkali-free glass, low alkali glass, metal foils, plastics such as a heat resistant polyimide, carbon fibers or the like can be used as a material for the substrate. Consequently, CIS-based solar cells with various shapes and properties, such as a light-weight flexible solar cell can be produced.

According to the method of the present embodiment for producing a solar cell, since the silicate layer 2 is deposited on top of the substrate 1 by a radio frequency (RF) magnetron sputtering process, a high-performance CIS-based solar cell can be produced easily and also at a low cost without impairing the bonding properties within the interface between the substrate 1 and the back electrode layer 3.

It should be noted that the CIS-based solar cell of the present embodiment is capable of retaining its function as a solar cell even when the solar cell portion is separated, following the production thereof, either at the interface between the substrate 1 and the silicate layer 2 or at the interface between the silicate layer 2 and the back electrode layer 3. Therefore, it is also possible to remove the substrate 1 following the solar cell production, and it is not necessarily required to retain the structure constituted of the substrate 1, the silicate layer 2, the back electrode layer 3, the CIS-based photoelectric conversion layer 4, the buffer layer 5, the highly resistive zinc oxide layer 6 and the transparent conductive layer 7 following the solar cell production.

The invention claimed is:

1. A solar cell comprising:
a substrate selected from a material selected from the group consisting of a heat resistant polyimide and a ceramic;
a lower electrode layer;
a photoelectric conversion layer having a chalcopyrite structure that includes a Group Ib element, a Group IIIb element and a Group VIb element; and
an upper electrode layer,
the lower electrode layer, the photoelectric conversion layer and the upper electrode layer being sequentially formed on top of the substrate; and
a silicate layer provided between the substrate and the lower electrode layer, the silicate layer comprising Na₂O.CaO.5SiO₂ or Na₂O.2MgO.6SiO₂ as a major component;
an alkali metal derived from the silicate layer being diffused from the silicate layer to the photoelectric conversion layer via the lower electrode layer,
the solar cell being formed substantially without incorporation of a precursor of the diffused alkali metal between the lower electrode layer and the photoelectric conversion layer or between the photoelectric conversion layer and the upper electrode layer.

2. The solar cell according to claim 1, wherein the photoelectric conversion layer having a chalcopyrite structure is a CIS-based photoelectric conversion layer comprising $Cu(In_{1-x}Ga_x)(Se_yS_{1-y})_2$ ($0 \leq x \leq 1$, $0 \leq y \leq 1$) as a major component thereof.

3. The solar cell according to claim 1, wherein the heat resistant polyimide is a wholly aromatic polyimide having a repeating unit represented by a formula (I) shown below:

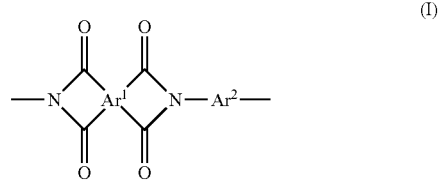

wherein $Ar^1$ represents a tetravalent aromatic group of 6 to 20 carbon atoms, and $Ar^2$ represents a divalent aromatic group of 6 to 20 carbon atoms which optionally contains an unreactive substituent.

4. The solar cell according to claim 1, wherein the silicate layer is deposited on top of the substrate by a magnetron sputtering process.

5. The solar cell according to claim 4, wherein the magnetron sputtering process is a radio frequency magnetron sputtering process.

6. The solar cell according to claim 1, wherein the photoelectric conversion layer is formed under such conditions that a sufficient portion of an alkali metal contained in the silicate layer diffuses through the lower electrode layer to the photoelectric conversion layer to enhance a photoelectric efficiency of the photoelectric conversion layer.

7. The solar cell according to claim 1, wherein the silicate layer is deposited on top of the substrate by a magnetron sputtering process.

8. The solar cell according to claim 4, wherein the magnetron sputtering process is a radio frequency magnetron sputtering process.

9. The solar cell according to claim 1, wherein the substrate comprises a ceramic.

10. The solar cell according to claim 1, having an open circuit voltage of at least 0.619V.

11. The solar cell according to claim 1, having a short circuit current density of at least 34.6 mA/cm².

12. A solar cell formed in sequence on a substrate selected from a material selected from the group consisting of a heat resistant polyimide and a ceramic, comprising;
a silicate layer comprising Na₂O.CaO.5SiO₂ or Na₂O.2MgO.6SiO₂ as a major component deposited on the substrate;
a lower electrode layer deposited on the silicate layer;

a photoelectric conversion layer deposited on the lower electrode layer, having a chalcopyrite structure that includes a Group Ib element, a Group IIIb element and a Group VIb element, processed to provide a portion of Na diffused from the silicate layer through the lower electrode layer, sufficient to enhance a photoelectric efficiency of the photoelectric conversion layer as compared to photoelectric efficiency of the photoelectric conversion layer absent the alkali metal portion; and an upper electrode layer formed on the photoelectric conversion layer, wherein the photoelectric conversion layer is diffused with an alkali metal derived from the silicate layer via the lower electrode layer, substantially without incorporation of a precursor for the diffused alkali metal between the lower electrode layer and the photoelectric conversion layer and substantially without incorporation of a precursor for the diffused alkali metal between the photoelectric conversion layer and the upper electrode layer.

13. The solar cell according to claim 12, wherein the photoelectric conversion layer having a chalcopyrite structure is a CIS-based photoelectric conversion layer comprising $Cu(In_{1-x}Ga_x)(Se_yS_{1-y})_2$ ($0 \le x \le 1$, $0 \le y \le 1$) as a major component thereof.

14. The solar cell according to claim 12, wherein the substrate comprises a wholly aromatic heat resistant polyimide having a repeating unit represented by a formula (I) shown below:

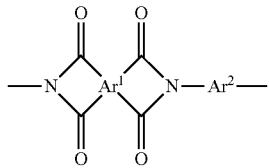

(I)

wherein $Ar^1$ represents a tetravalent aromatic group of 6 to 20 carbon atoms, and $Ar^2$ represents a divalent aromatic group of 6 to 20 carbon atoms which optionally contains an unreactive substituent.

15. A solar cell, deposited on a heat-resistant polyimide or ceramic substrate, comprising:

a photoelectric conversion layer having a chalcopyrite structure that includes a Group Ib element, a Group IIIb element and a Group VIb element, having diffused therein a sufficient amount of a Group Ia element to enhance a photoelectric efficiency of the photoelectric conversion layer as compared to photoelectric efficiency of the photoelectric conversion layer absent the diffused Group Ia element;

a silicate layer comprising a glass having a Group Ia element portion, which is diffusible at elevated temperatures, formed adjacent to the substrate;

a lower electrode layer comprising a conductive material deposited between the silicate layer and the photoelectric conversion layer; and an upper electrode layer formed on an opposite side of the photoelectric conversion layer with respect to the lower electrode layer, wherein the sufficient amount of the Group Ia metal is diffused from the silicate layer to the photoelectric conversion layer through the lower electrode layer, wherein the interface between the lower electrode layer and the photoelectric conversion layer, and the interface between the photoelectric conversion layer and the upper electrode layer are formulated substantially without a source of a diffusible Group Ia metal, and wherein a voltage potential between the lower electrode layer and the upper electrode layer is developed under illumination of the photoelectric conversion layer.

16. The solar cell according to claim 15, wherein the photoelectric conversion layer having a chalcopyrite structure is a CIS-based photoelectric conversion layer comprising $Cu(In_{1-x}Ga_x)(Se_yS_{1-y})_2$ ($0 \le x \le 1$, $0 \le y \le 1$) as a major component thereof.

17. The solar cell according to claim 15, wherein the heat-resistant polyimide or ceramic substrate comprises a wholly aromatic heat resistant polyimide having a repeating unit represented by a formula (I) shown below:

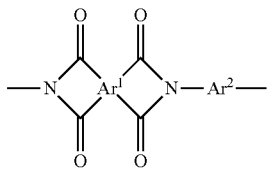

(I)

wherein $Ar^1$ represents a tetravalent aromatic group of 6 to 20 carbon atoms, and $Ar^2$ represents a divalent aromatic group of 6 to 20 carbon atoms which optionally contains an unreactive substituent.

18. The solar cell according to claim 15, wherein the silicate layer comprises $Na_2O.CaO.5SiO_2$ or $Na_2O.2MgO.6SiO_2$ as a major component.

* * * * *